United States Patent
Ono et al.

(10) Patent No.: US 8,788,856 B2
(45) Date of Patent: Jul. 22, 2014

(54) CONTROL APPARATUS AND METHOD

(75) Inventors: Takatsugu Ono, Kawasaki (JP); Takeshi Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 150 days.

(21) Appl. No.: 13/525,776

(22) Filed: Jun. 18, 2012

(65) Prior Publication Data

US 2013/0042120 A1 Feb. 14, 2013

(30) Foreign Application Priority Data

Aug. 8, 2011 (JP) ................................. 2011-172668

(51) Int. Cl.
    *G06F 13/00* (2006.01)
(52) U.S. Cl.
    USPC ........................................................ 713/320
(58) Field of Classification Search
    USPC ........................................................ 711/165
    See application file for complete search history.

(56) References Cited

U.S. PATENT DOCUMENTS

| 2005/0138442 | A1* | 6/2005 | Keller et al. | 713/300 |
| 2007/0011421 | A1* | 1/2007 | Keller et al. | 711/165 |
| 2011/0264854 | A1* | 10/2011 | Ouchi | 711/114 |
| 2011/0276817 | A1* | 11/2011 | Fullerton et al. | 713/324 |

FOREIGN PATENT DOCUMENTS

| JP | 8-234872 | 9/1996 |
| JP | 2007-086909 | 4/2007 |

* cited by examiner

*Primary Examiner* — Hoai V Ho
*Assistant Examiner* — Min Huang
(74) *Attorney, Agent, or Firm* — Fujitsu Patent Center (57) ABSTRACT

An apparatus includes: a first storage unit storing data representing whether transition is prohibited, for each of a plurality of blocks in a memory device, for each of which power control is carried out; a second storage unit storing, for each of a plurality of threads, an identifier of the thread in association with the number of times that access by the thread to a block in the energy-saving state is requested; and a controller that increments the number of times which is stored in the second storage unit and is associated with an identifier of a requesting source thread of a request, upon detecting a block including an access destination of the request is in the energy-saving state, and sets data representing the transition is prohibited for the block including the access destination of the request upon detecting the number of times after incrementing exceeds a threshold.

4 Claims, 6 Drawing Sheets

| DIMM1 | | DIMM2 | |
|---|---|---|---|
| Rank0 | Rank1 | Rank0 | Rank1 |
| 0 | 1 | 0 | 1 |

FIG.8

| DIMM1 | | DIMM2 | |
|---|---|---|---|
| Rank0 | Rank1 | Rank0 | Rank1 |
| 0 | 0 | 0 | 0 |

FIG.9

| THREAD ID | COUNTER VALUE | THRESHOLD |
|---|---|---|
| A | 2 | 3 |
| B | 4 | 3 |

CONTROL APPARATUS AND METHOD

CROSS-REFERENCE TO RELATED APPLICATIONS

This application is based upon and claims the benefit of priority of the prior Japanese Patent Application No. 2011-172668, filed on Aug. 8, 2011, the entire contents of which are incorporated herein by reference.

FIELD

This technique relates to a technique for controlling a memory device.

BACKGROUND

For example, the main memory of a computer includes one or plural memory modules such as a Dual Inline Memory Module (DIMM), and one memory module includes one or plural Ranks, each of which is a unit for inputting or outputting data. A Rank is also a unit of power control.

When a specific Rank is not accessed within a predetermined amount of time, for example, a memory access controller (MAC) that is connected to a central processing unit (CPU) carries out control to switch the operating mode of the specific Rank to an energy-saving mode.

Figure 1:
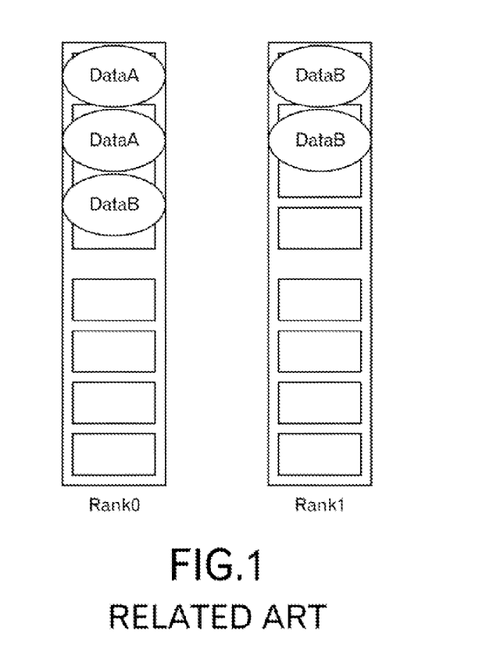
FIG. 1 is a diagram to explain Ranks.

For example, a case where a central processing unit (CPU) executes two threads A and B of one program at the same time is assumed. In such a case, as schematically illustrated in FIG. 1, it is also assumed that data DataA for thread A and data DataB for thread B are stored in Rank0, and data DataB for thread B is stored in Rank1. It is further assumed that memory access of thread A occurs frequently at short intervals, and that memory access of thread B occurs at comparatively long intervals. As a result, because the frequency of accessing Rank1 is low, it becomes easy to switch to the energy-saving mode. Therefore, it is assumed that Rank1 is often in the energy-saving mode when thread B accesses the memory.

Figure 2:
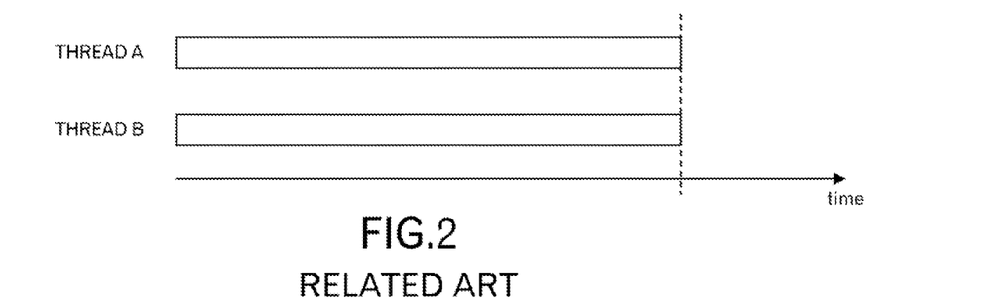
FIG. 2 is a diagram to explain problems in a conventional art.
Figure 3:
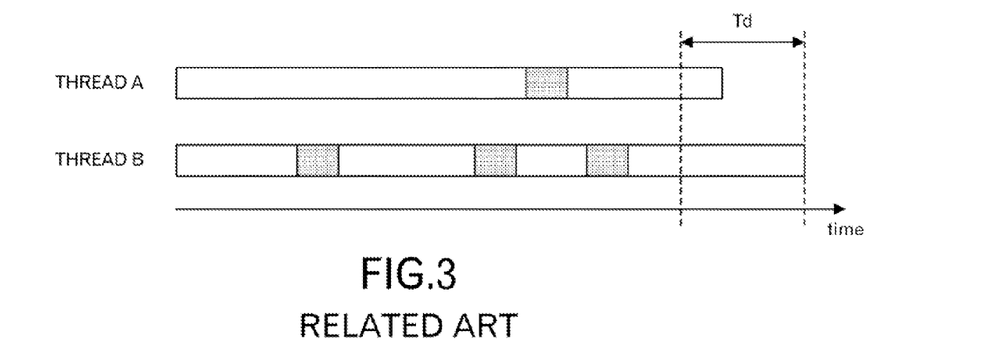
FIG. 3 is a diagram to explain programs in the conventional art.

For example, when the operating mode of neither Rank is switched to the energy-saving mode, the execution times for thread A and thread B are assumed to be the same as illustrated in FIG. 2. However, when controlling the power such as switching to the energy-saving mode when the access frequency is low, there is a possibility, as illustrated in FIG. 3, that stalling due to accessing a Rank in the energy-saving mode occurs more often in thread B than in thread A. When stalling occurs often only in a specific thread, the execution time for the specific thread becomes longer, and thus the overall execution time becomes longer. In the example in FIG. 3, the execution time becomes longer by a time Td than the time in the case when there is no switching to the energy-saving mode. In the case where thread A waits for thread B in order to synchronize thread A with thread B, the execution time similarly becomes longer. As a result, even though power for the memory can be preserved, the amount of time that the central processing unit uses becomes longer, so there is a possibility that the overall amount of power consumed per unit time by the central processing unit will increase.

There exists a technique for managing power necessary for a device in the activated state or stopped state of a task with the objective of reducing unnecessary power consumption, as well as a technique for managing the number of memory blocks that were assigned, for each memory region, and stopping the supply of power when the number of assigned memory blocks reaches a threshold value (for example, 0).

However, these techniques do not take into consideration problems such as described above.

In other words, there is no technique for suppressing unbalance of the execution times among plural threads generated from one program.

SUMMARY

A control apparatus relating to this technique includes: (A) a first data storage unit storing data representing whether or not transition to an energy-saving state is prohibited, for each of memory blocks in a memory device, wherein power control is carried out for each of the memory blocks; (B) a second data storage unit storing the number of times that access to a memory block that is in the energy-saving state is requested, for each of threads of a certain program; and (C) a first controller that increments the number of times of a requesting source thread of a memory request, which is stored in the second data storage unit, upon detection that a memory block including an access destination of the memory request received from a processing unit is in the energy-saving state, and sets data representing that the transition to the energy-saving state is prohibited in the first data storage unit for the memory block including the access destination of the memory request upon detection that the number of times after incrementing exceeds a threshold.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Embodiment 1

Figure 4:
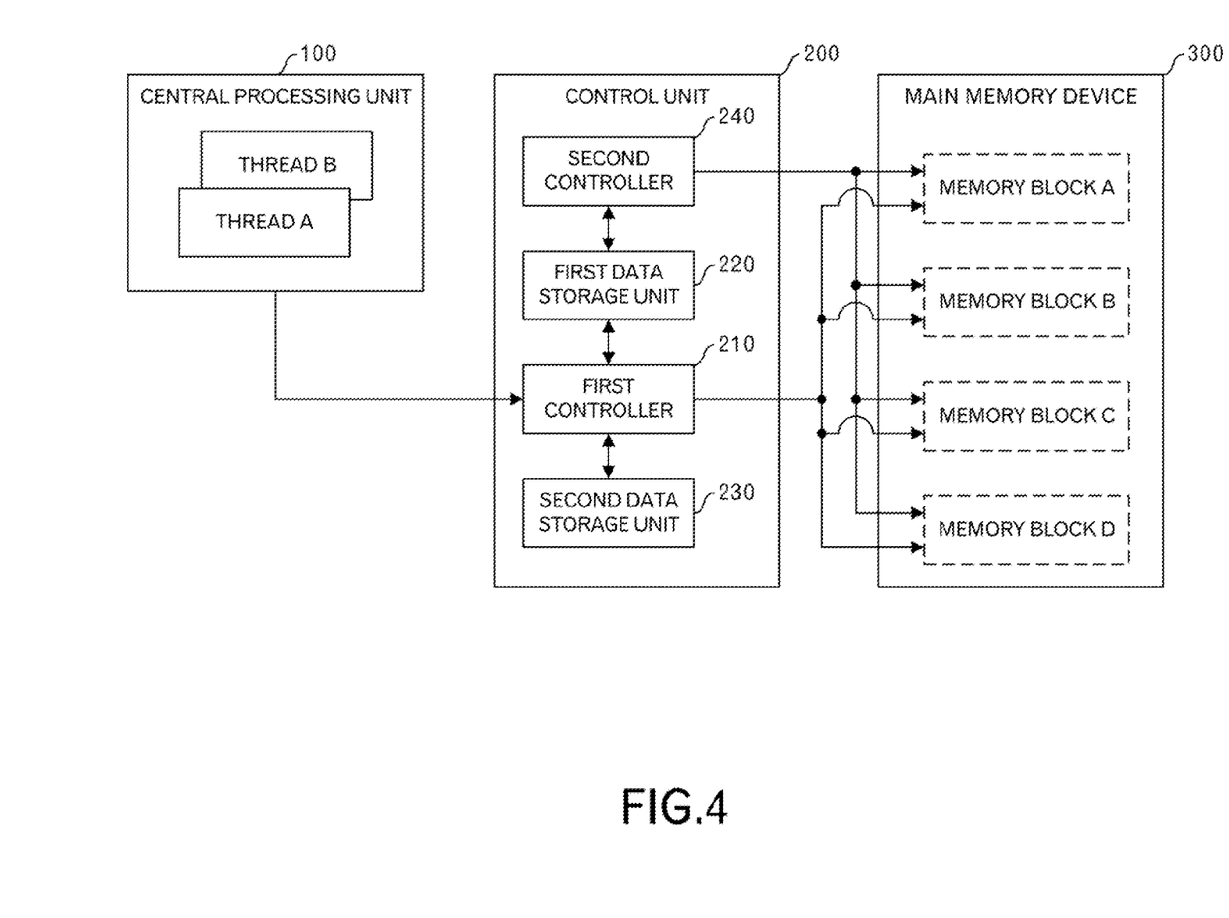
FIG. 4 is a diagram to explain a configuration example in a first embodiment.

FIG. 4 illustrates an example of a configuration in an embodiment of this technique. FIG. 4 illustrates part of a computer, wherein a control unit 200 is connected to a central processing unit 100 and a main memory device 300. The central processing unit 100 executes plural threads (for example, threads A and B) for one program. The main memory device 300 includes plural memory blocks (for example, memory blocks A to D), each of which is a unit of power control. In other words, for each memory block, power control is carried out to switch from the normal state (or also called the normal mode) to the energy-saving state (or also called the energy-saving mode, the low power state or the lower power mode). It is assumed that the control unit 200 manages the range of addresses for each memory block.

The control unit 200 has a first controller 210 that carries out a main processing of this embodiment, a first data storage unit 220, a second data storage unit 230, and a second controller 240 that carries out power control for each of the memory blocks in the main memory device 300.

The first data storage unit 220 stores data that represents for each memory block described above, whether or not switching (or transition) to the energy-saving state is prohibited. The second data storage unit 230 stores the number of times that access to a certain memory block that is in the energy-saving state is requested, for each thread of a certain program.

The first controller 210 uses the data stored in the first data storage unit 220 and the second data storage unit 230 in response to a memory request from the central processing unit 100, and carries out the processing described below. The first controller 210 also, as a result of processing, may store data in the first data storage unit 220, and may store data in the second data storage unit 230.

Next, a processing carried out by the devices and units illustrated in FIG. 4 will be explained using FIG. 5. The processing in FIG. 5 is executed each time a memory request from the central processing unit 100 is processed.

Figure 5:
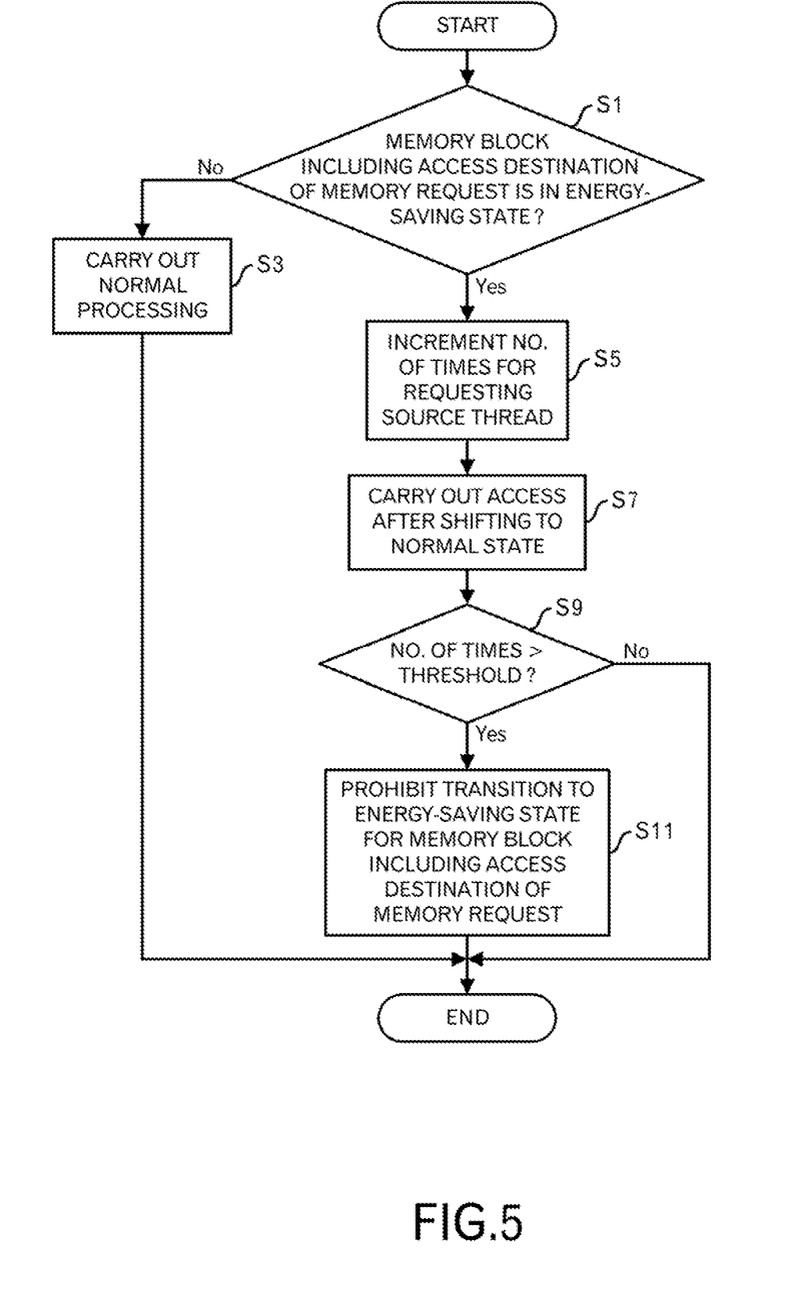
FIG. 5 is a diagram illustrating a processing flow in the first embodiment.

For example, when the first controller 210 receives a memory request from the central processing unit 100 and is in the stage of processing that memory request, the first controller 210 determines whether the memory block that includes the access destination of the memory request is in the energy-saving state (FIG. 5: step S1). Data that represents whether or not each memory block is in the energy-saving state may be managed by the first controller 210, or for example, the second controller 240 may store the data in the first data storage unit 220, and the first controller 210 may reference that data.

When the memory block that includes the access destination of the memory request is not in the energy-saving state, the first controller 210 carries out a normal processing (step S3). More specifically, the first controller 210 carries out reading or writing to or from the main memory device 300 according to the memory request. Processing then ends.

On the other hand, when the memory block that includes the access destination of the memory request is in the energy-saving state, the first controller 210 increases the number of times for the requesting source thread of that memory request by "1" in the second data storage unit 230 (step S5). For example, the memory request includes a thread identifier (or ID), and the thread is identified from the memory request.

Then, the first controller 210 causes the second controller 240 to switch the memory block that includes the access destination of the memory request to the normal state, and then accesses the main memory device 300 according to the memory request (step S7). The second controller 240 switches the state of the memory block that includes the access destination of the memory request to the normal state in response to an instruction from the first controller 210, for example, or according to a state change instruction data that the first controller wrote to the first data storage unit 220.

Furthermore, the first controller 210 determines whether or not the number of times for the request source thread, which is stored in the second data storage unit 230, has exceeded a predetermined threshold value (step S9). The predetermined threshold value may be stored in the second data storage unit 230, and in the case of a fixed value, may be saved in the first controller 210 itself. When the number of times for the requesting source thread has not exceeded the predetermined threshold value, the processing ends. When the number of times for the requesting source thread has exceeded the predetermined threshold value, the first controller 210 stores data to prohibit switching or transition to the energy-saving state in the first data storage unit 220, for the memory block that includes the access destination of the memory request (step S11). According to this kind of data to prohibit switching or transition to the energy-saving state, the second controller 240 does not switch the state of this memory block to the energy-saving state even though the access frequency is equal to or less than the predetermined threshold value. Processing then ends.

Figure 6:
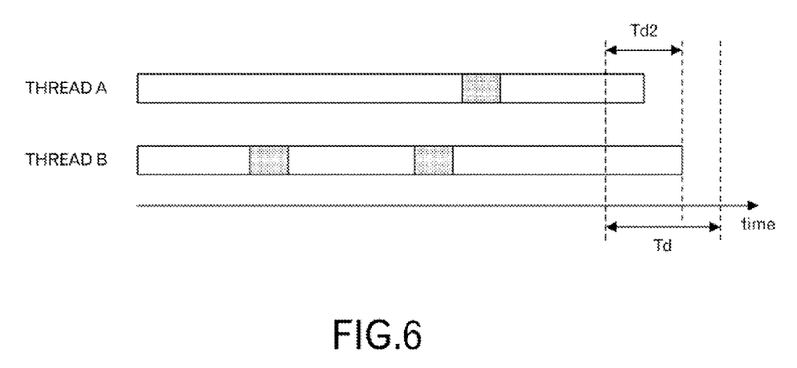
FIG. 6 is a diagram to explain an effect in the first embodiment.

By carrying out such a processing, it is possible to prevent the execution time of a specific thread from among the plural threads for one program from becoming longer. For example, as is schematically illustrated in FIG. 6, by setting "2" to the threshold value, the number of times that stalling occurs is reduced by one time than that in the example illustrated in FIG. 3, and the execution time that becomes longer is shortened to Td2 (<Td), when compared with the case of not switching to the energy-saving state as in FIG. 2. Moreover, inequality in the execution time among threads is corrected. Furthermore, it is possible to reduce the amount of power consumed by the central processing unit 100 by approximately the amount of one stalling. Although an example that the embodiment is applied to the relationship between the central processing unit 100 and the main memory device 300 was explained, this embodiment can also be applied to other relationship between other operation processing units, which execute a program with multi-threads, and other memory devices.

Embodiment 2

Figure 7:
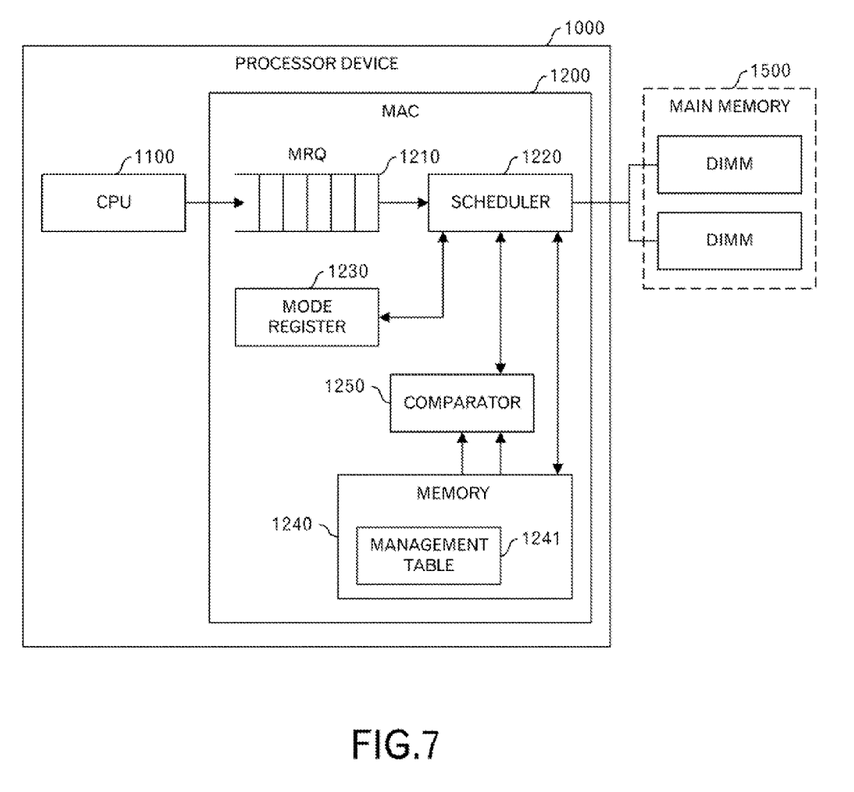
FIG. 7 is a diagram to explain a configuration example in a second embodiment.

An example of a configuration in a second embodiment of this technique is illustrated in FIG. 7. The processor device 1000 in this embodiment has a central processing unit (CPU) 1100 and a memory access controller (MAC) 1200. It is assumed that a cache is also included in the CPU 1100. The processor device 1000 is connected to a main memory 1500. In this embodiment, the main memory 1500 includes one or plural DIMMs. A DIMM includes one or plural Ranks. For example, when memory chips are mounted on both sides of the DIMM, one side may be one Rank.

The MAC 1200 has a memory request queue (MRQ) 1210, a scheduler 1220, a mode register 1230, a comparator 1250 and a memory 1240.

The MRQ 1210 is a queue that stores memory requests that are outputted from the CPU 1100. A memory request includes a thread ID for identifying the requesting source thread of one program that is being executed by the CPU 1100, an access destination address and data representing whether the request is a read or write request.

Figure 8:
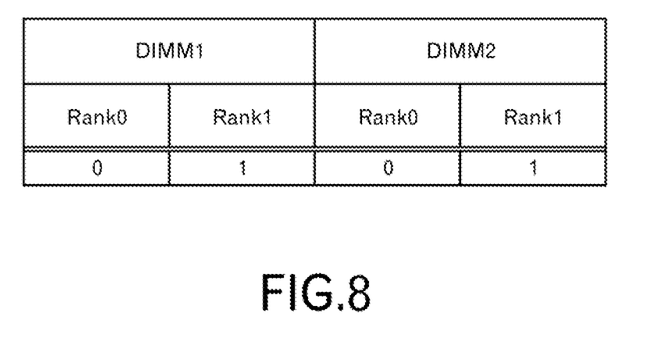
FIG. 8 is a diagram illustrating an example of data for managing states of respective Ranks.

The scheduler 1220 carries out access control for the memory request, and power control for each Rank in the main memory 1500. In order to carry out power control, the scheduler 1220 holds, for each Rank, data that represents whether or not that Rank is in the energy-saving state or in the normal state. FIG. 8 illustrates an example in which two Ranks are included for each DIMM, and for each of Rank0 and Rank1 of DIMM1 data that represents the energy-saving state (for example, "1") or the normal state (for example "0") is stored, and for each of Rank0 and Rank1 for DIMM2 data that represents the energy-saving state or normal state is stored. The scheduler 1220 manages the address range for each Rank.

Figure 9:
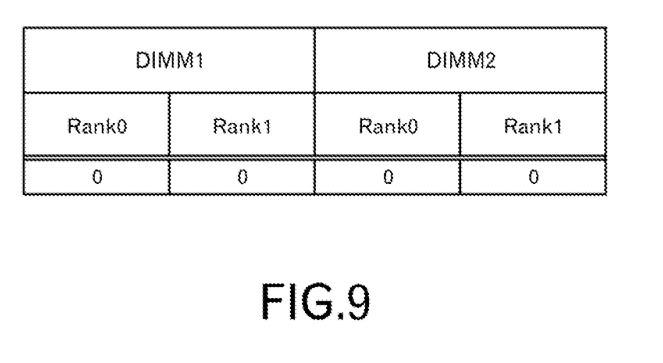
FIG. 9 is a diagram illustrating an example of data stored in a mode register.

The mode register 1230 is a register that stores a flag that represents whether or not switching or transition to the energy-saving state is prohibited ("1" when prohibited, and "0" when not prohibited). The mode register 1230, for example, stores data such as illustrated in FIG. 9. FIG. 9 illustrates an example in which there are two Ranks included in each DIMM, and for DIMM1, a flag that is "0" or "1" is stored for each of Rank0 and Rank1, and for DIMM2, a flag that is "0" or "1" is stored for each of Rank0 and Rank1.

Figure 10:
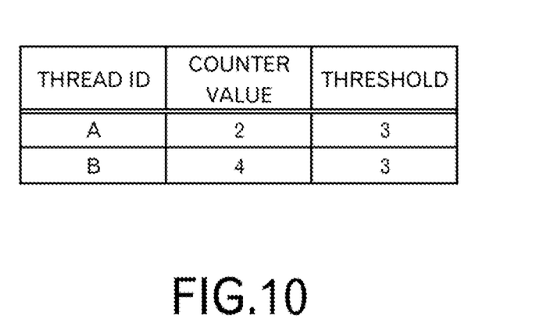
FIG. 10 is a diagram illustrating an example of a management table.

The memory 1240 stores, for each thread, a management table 1241 that stores the number of times the memory block that includes the access destination of the memory request that was read from the MRQ 1210 was in the energy-saving state. The format of the management table 1241 is such as illustrated in FIG. 10. In the example in FIG. 10, for each thread ID, a count value that represents the aforementioned number of times, and a threshold value are stored. The threshold value may be the same fixed value for each thread, or for example, may be a threshold value that is preset for each thread that is generated for a program, when that program begins to be executed.

The comparator 1250 reads the counter value and threshold value for a specific thread from the management table 1241 in response to an instruction from the scheduler 1220, and carries out a comparison, and when the counter value is greater than the threshold value, the comparator 1250 outputs a signal representing that the counter value is greater than the threshold value to the scheduler 1220.

Figure 11:
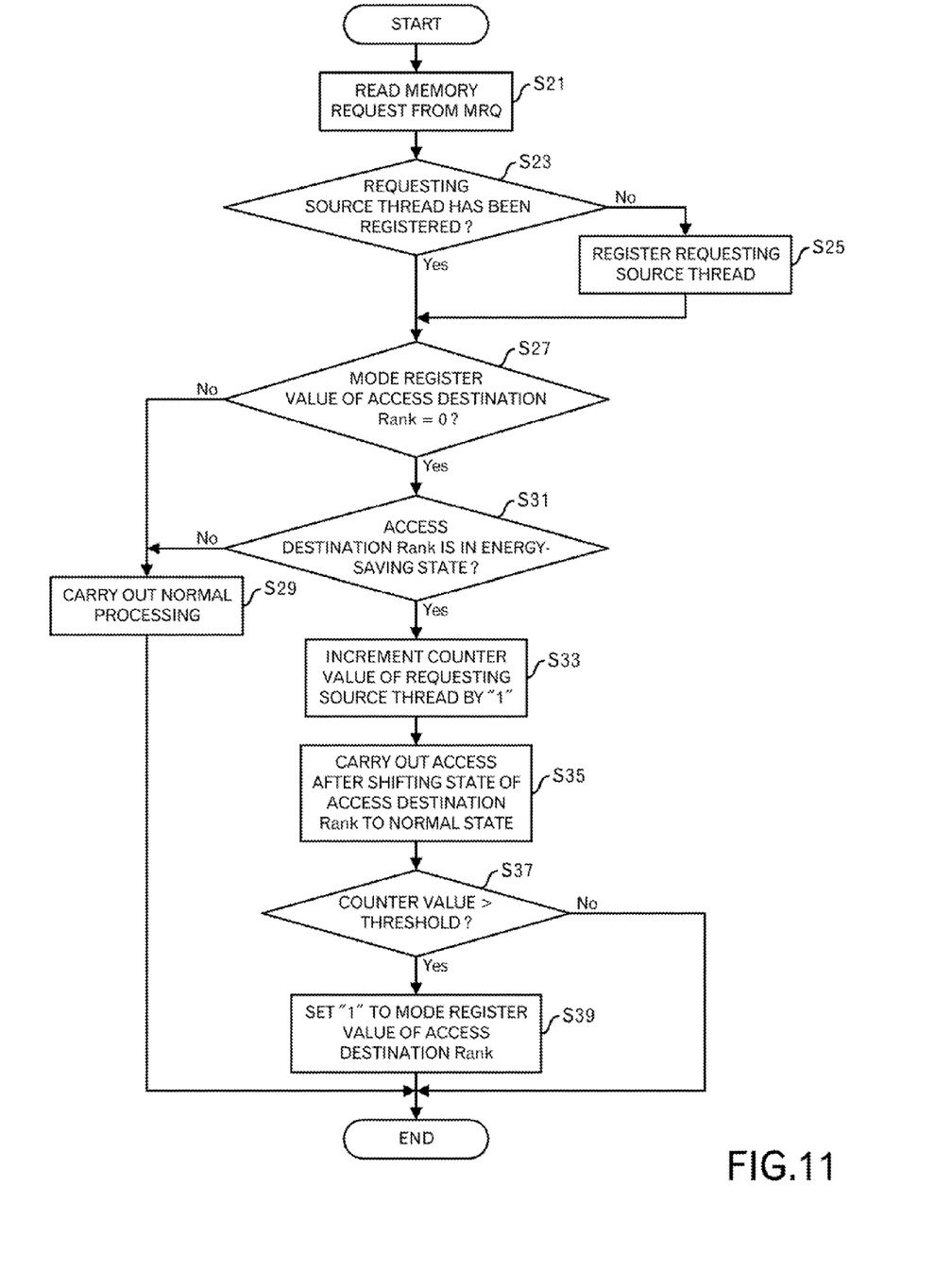
FIG. 11 is a diagram illustrating a processing flow in the second embodiment.

Next, the contents of the processing for the configuration illustrated in FIG. 7 will be explained using FIG. 11. This processing is executed for each memory request. First, the scheduler 1220 reads one memory request from the MRQ 1210 (FIG. 11: step S21). Then, the scheduler 1220 determines whether or not the requesting source thread for that memory request has been registered in the management table 1241 (step S23). When the requesting source thread is not registered in the management table 1241, the scheduler 1220 registers data for the requesting source thread in the management table 1241 (step S25). For example, the scheduler 1220 registers the thread ID, counter value=0 and the threshold value. The threshold value may be a fixed value as described above, or may be a value designated by the program. Processing then moves to step S27.

When the request source thread for the memory request is registered in the management table 1241, or after step S25, the scheduler 1220 identifies the Rank which includes the access destination of the memory request, and determines whether or not the mode register value of that Rank in the mode register 1230 is "0", or in other words, determines whether or not switching or transition to the energy-saving state is not prohibited (step S27). When the mode register value of that Rank in the mode register 1230 is "1", or in other words, when switching or transition to the energy-saving state is prohibited, the scheduler 1220 carries out a normal processing (step S29). In other words, reading or writing of data to or from a word in the access destination address is carried out. Processing then ends.

On the other hand, when the mode register value of that Rank in the mode register 1230 is "0", the scheduler 1220 determines whether or not the Rank of the access destination of the memory request is currently in the energy-saving state (step S31). The current status is known based on data such as illustrated in FIG. 8. When the Rank of the access destination is currently in the normal state, processing moves to step S29 without carrying out any special processing.

On the other hand, when the Rank of the access destination is currently in the energy-saving state, the scheduler 1220 increments the counter value for the requesting source thread in the management table 1241 by "1" (step S33). The scheduler 1220 also switches the state of the Rank of the access destination of the memory request to the normal state, and then carries out access according to the memory request (step S35). The scheduler 1220 then reads or writes data to or from the address of the access destination.

After that, according to an instruction from the scheduler 1220, the comparator 1250 compares the counter value with the threshold value for the requesting source thread in the management table 1241, and determines whether or not the counter value>the threshold value is satisfied (step S37). When the counter value is equal to or less than the threshold value, processing ends. However, when the counter value>the threshold value is satisfied, the comparator 1250 outputs a signal to the scheduler 1220, and the scheduler 1220 sets "1" to the mode register value for the Rank that includes the access destination of the memory request in the mode register 1230 (step S39). Processing then ends.

By doing so, for a specific thread from among plural threads generated for one program, it is possible to avoid the number of stalls that occur due to the Rank of the access destination being in the energy-saving state from becoming biased. In other words, it is possible to prevent imbalance in the execution time among plural threads. Accordingly, it is possible to shorten the processing time of the overall program. In case where plural threads are synchronized, when there is imbalance in the execution time, the wait time becomes long, however, with this embodiment, it is possible to suppress imbalance in the execution time, so the wait time becomes short, and the processing time of the overall program is shortened.

Moreover, when there is imbalance in the execution time among plural threads, the core of the CPU 1100, which executed threads for which processing has finished consumes power in the idle state. The power that this CPU 1100 core consumes in the idle state is several tens of W, and the power that can be reduced by switching the Dynamic Random Access Memory (DRAM) of the DIMM used by the main memory 1500 to the energy-saving state is several W. Therefore, suppressing imbalance in execution time and shortening the processing time of the overall program results in reducing power consumption.

The scheduler 1220 measures the access interval for each Rank in the main memory 1500, and when there is no access for a predetermined amount of time or more, a processing is carried out to switch the state of such a Rank to the energy-saving state. However, the scheduler 1220 does not switch the states of Ranks, for which "1" is set to the flag in the mode register 1230 that represents whether or not switching or transition to the energy-saving state is prohibited, to the energy-saving state.

Moreover, in the processing flow illustrated in FIG. 11, when a thread is not registered in the management table 1241, a processing to register the thread is carried out, however, the scheduler 1220 also carries out a processing to delete threads that do not access the main memory 1500 for a predetermined amount of time or more from the management table 1241. Furthermore, when there are no more threads registered in the management table 1241, the values of all of the mode registers in the mode register 1230 are initialized to "0".

Although the embodiments of the technique were explained above, this technique is not limited to these embodiments. For example, the functional block diagrams are mere examples, and may not correspond to actual module or device configuration. As for the processing flow, as long as the processing results do not change, the order of the steps may be exchanged or the steps may be executed in parallel such as the steps S33 and S35.

Moreover, although an example that the MAC 1200 is included in the processor device 1000 was illustrated, MAC 1200 may be implemented on other semi-conductor devices.

The embodiments of this technique are summarized as follows:

A control apparatus relating to the embodiments includes: (A) a first data storage unit storing data representing whether or not transition to an energy-saving state is prohibited, for each of memory blocks in a memory device, wherein power control is carried out for each of the memory blocks; (B) a second data storage unit storing the number of times that access to a memory block that is in the energy-saving state is requested, for each of threads of a certain program; and (C) a first controller that increments the number of times of a requesting source thread of a memory request, which is stored in the second data storage unit, upon detection that a memory block including an access destination of the memory request received from a processing unit is in the energy-saving state, and sets data representing that the transition to the energy-saving state is prohibited in the first data storage unit for the memory block including the access destination of the memory request upon detection that the number of times after incrementing exceeds a threshold.

By adopting such a configuration, imbalance of the execution times among threads of the certain program is suppressed, because the transition to the energy-saving state is suppressed for the memory block to which access frequently occurs. Namely, it becomes possible to shorten the processing time of the certain program, and reduce the power consumption.

The controller apparatus relating to the embodiments may further includes: a second controller that carries out power control of the memory device based on the data stored in the first data storage unit.

Furthermore, the aforementioned first controller may determine whether or not the first data storage unit stores data representing that the transition to the energy-saving state is not prohibited for the memory block including the access destination of the memory request, and may carry out a processing upon detection that the data representing that the transition to the energy-saving state is not prohibited. When the transition to the energy-saving state is prohibited, the processing is simplified.

Incidentally, it is possible to create a program for causing a memory access controller to carry out the aforementioned processing, and the program may be stored in a computer-readable storage medium or storage device such as flexible disk, optical disc such as CD-ROM and DVD-ROM, magneto-optical disk, semiconductor memory (e.g. ROM) or Hard disk.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A control apparatus, comprising:
   a first data storage unit storing data representing whether or not transition to an energy-saving state is prohibited, for each of a plurality of memory blocks in a memory device, wherein power control is carried out for each of the plurality of memory blocks;
   a second data storage unit storing, for each of a plurality of threads of a program, an identifier of the thread in association with the number of times that access by the thread to a memory block that is in the energy-saving state is requested; and
   a first controller that increments the number of times which is stored in the second data storage unit and is associated with an identifier of a requesting source thread of a memory request, upon detection that a memory block including an access destination of the memory request received from a processing unit is in the energy-saving state, and sets data representing that the transition to the energy-saving state is prohibited in the first data storage unit for the memory block including the access destination of the memory request upon detection that the number of times after incrementing exceeds a threshold.

2. The controller apparatus as set forth in claim 1, further comprising:
   a second controller that carries out power control of the memory device based on the data stored in the first data storage unit.

3. The controller apparatus as set forth in claim 1, wherein the first controller determines whether or not the first data storage unit stores data representing that the transition to the energy-saving state is not prohibited for the memory block including the access destination of the memory request, and carries out a processing upon detection that the data representing that the transition to the energy-saving state is not prohibited.

4. A control method, comprising:
   determining whether or not a memory block including an access destination of a memory request received from a processing unit among a plurality of memory blocks is in an energy-saving state, wherein power control is carried out for each of the plurality of memory blocks;
   upon detection that the memory block including the access destination of the memory request is in the energy-saving state, incrementing the number of times which is associated with an identifier of a requesting source thread of the memory request and is stored in a first data storage unit that stores, for each of a plurality of threads of a program, an identifier of the thread in association with the number of times that access by the thread to a memory block that is in the energy-saving state is requested;
   determining whether or not the number of times after the incrementing exceeds a predetermined threshold;
   upon detection that the number of times after the incrementing exceeds the predetermined threshold, setting data representing that transition to the energy-saving state is prohibited, for the memory block including the access destination of the memory request in a second data storage unit storing data representing whether or not the transition to the energy-saving state is prohibited, for each of the plurality of memory blocks.

* * * * *